United States Patent
Cho et al.

(10) Patent No.: US 8,680,883 B2
(45) Date of Patent: Mar. 25, 2014

(54) TIME DEPENDENT DIELECTRIC BREAKDOWN (TDDB) TEST STRUCTURE OF SEMICONDUCTOR DEVICE AND METHOD OF PERFORMING TDDB TEST USING THE SAME

(75) Inventors: Yong-sang Cho, Hwaseong-si (KR); Jang-hyuk An, Yongin-si (KR); Ihl-hwa Moon, Hwaseong-si (KR); Jae-young Lee, Suwon-si (KR); Kyung-hwan Kim, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 452 days.

(21) Appl. No.: 13/093,016

(22) Filed: Apr. 25, 2011

(65) Prior Publication Data

US 2011/0279142 A1  Nov. 17, 2011

(30) Foreign Application Priority Data

May 11, 2010 (KR) ............... 10-2010-0044059

(51) Int. Cl.
 *G01R 31/02* (2006.01)
 *G01R 31/12* (2006.01)
 *H01L 23/58* (2006.01)

(52) U.S. Cl.
 USPC ............. 324/762.01; 324/756.01; 324/762.1; 257/48; 438/18

(58) Field of Classification Search
 USPC .............. 324/762.01, 537–763.02; 257/48; 438/14–18
 See application file for complete search history.

(56) References Cited

U.S. PATENT DOCUMENTS

| | | | | |
|---|---|---|---|---|
| 6,489,783 | B1 * | 12/2002 | Liu et al. ............... | 324/663 |
| 7,851,793 | B2 * | 12/2010 | Wang et al. ............. | 257/48 |
| 2007/0103184 | A1 * | 5/2007 | Kim ....................... | 324/769 |
| 2008/0128692 | A1 * | 6/2008 | Shi et al. ................ | 257/48 |
| 2009/0201028 | A1 * | 8/2009 | Tsuru .................... | 324/551 |
| 2011/0037490 | A1 * | 2/2011 | Martin et al. .......... | 324/756.01 |
| 2011/0074459 | A1 * | 3/2011 | Ruan et al. ............. | 324/762.01 |

FOREIGN PATENT DOCUMENTS

| | | |
|---|---|---|
| JP | 06-334015 | 12/1994 |
| JP | 09-178800 | 7/1997 |
| KR | 1020060091025 A | 8/2006 |
| KR | 1020090033615 A | 6/2009 |

* cited by examiner

*Primary Examiner* — Jermele M Hollington
*Assistant Examiner* — Emily Chan
(74) *Attorney, Agent, or Firm* — Volentine & Whitt, PLLC

(57) ABSTRACT

A time dependent dielectric breakdown (TDDB) test structure of a semiconductor device includes: a first test cell having a first test pattern in which a dielectric layer is formed between two electrodes; a second test cell spaced apart from the first test cell and having a second test pattern in which a dielectric layer is formed between two electrodes; and a barrier region configured to prevent electrical interference from occurring between the first test cell and the second test cell during a TDDB test.

16 Claims, 13 Drawing Sheets

TIME DEPENDENT DIELECTRIC BREAKDOWN (TDDB) TEST STRUCTURE OF SEMICONDUCTOR DEVICE AND METHOD OF PERFORMING TDDB TEST USING THE SAME

CROSS-REFERENCE TO RELATED APPLICATIONS

A claim of priority is made to Korean Patent Application No. 10-2010-0044059, filed on May 11, 2010, in the Korean Intellectual Property Office, the contents of which are hereby incorporated herein by reference in their entirety.

BACKGROUND

The inventive concept relates to a test structure of a semiconductor device and a method of performing a test using the test structure, and more particularly, to a time dependent dielectric breakdown (TDDB) test structure of a semiconductor device for determining whether a dielectric layer is broken during a TDDB test, and a method of performing the TDDB test using the TDDB structure.

A variety of tests are performed for semiconductor devices so as to obtain reliability for the semiconductor devices. Among these tests, a time dependent dielectric breakdown (TDDB) test is performed to electrically measure and evaluate a breakdown voltage of a dielectric layer, for example, a gate dielectric layer or a capacitor dielectric layer, and measure and evaluate the time taken to break the dielectric layer.

With the degree of integration of semiconductor devices increasing, and thicknesses of dielectric layers, for example, gate dielectric layers, decreasing, the time taken to perform the TDDB test increases. Moreover, the TDDB test is performed on each of a plurality of test patterns formed on a semiconductor substrate in order to increase the reliability of the TDDB test results. As a result, the time taken to perform the TDDB test increases.

SUMMARY

The inventive concept provides a time dependent dielectric breakdown (TDDB) test structure of a semiconductor device for measuring a plurality of test cells including test patterns while preventing interference between the test cells, thereby reducing the time taken to perform a TDDB test.

The inventive concept also provides a method of performing a TDDB test using the TDDB test structure of the semiconductor device.

According to an aspect of the inventive concept, there is provided a time dependent dielectric breakdown (TDDB) test structure of a semiconductor device including: a first test cell having a first test pattern in which a dielectric layer is formed between two electrodes; a second test cell spaced apart from the first test cell and having a second test pattern in which a dielectric layer is formed between two electrodes; and a barrier region configured to prevent electrical interference from occurring between the first test cell and the second test cell during a TDDB test.

The barrier region may be an isolation region for electrically separating or isolating the first test cell from the second test cell. The barrier region may be a current flow prevention region for preventing current from flowing between the first test cell and the second test cell when a stress voltage is simultaneously applied to the first test cell and the second test cell to perform the TDDB test.

The first test pattern and the second test pattern including the first test cell and the second test cell, respectively, may be capacitor patterns including a lower electrode, a capacitor dielectric layer, and an upper electrode. The first test pattern and the second test pattern including the first test cell and the second test cell, respectively, may be gate patterns including at least a portion of a semiconductor substrate, a gate dielectric layer formed on the semiconductor substrate, and a gate electrode formed on the gate dielectric layer.

The first test pattern and the second test pattern are each formed on a corresponding well of a first conductivity type formed in the semiconductor substrate, and the barrier region is a well of a second conductivity type opposite to the first conductivity type formed in the semiconductor substrate. The first test cell and the second test cell may be high voltage test cells or low voltage test cells. The first test cell may be a high voltage test cell and the second test cell may be a low voltage test cell.

According to another aspect of the inventive concept, there is provided a TDDB test structure of a semiconductor device including: a first test cell having a first test pattern in which a first dielectric layer and a first electrode are sequentially formed on a semiconductor substrate; a second test cell adjacent to the first test cell and having a second test pattern in which a second dielectric layer and a second electrode are sequentially formed on the semiconductor substrate; and a barrier region configured to prevent electrical interference from occurring between the first test cell and the second test cell during a TDDB test.

The first test cell may be formed on a first well of a first conductivity type in the semiconductor substrate, the second test cell may be formed on a second well of the first conductivity type in the semiconductor substrate, and the barrier region may be a third well of a second conduct type opposite to the first conductivity type and formed between the first and second wells. The first and second wells of the first conductivity type may be P wells, and the third well of the second conductivity type may be an N well.

The barrier region may be a current flow prevention configured to prevent current from flowing between the first test cell and the second test cell when a stress voltage is simultaneously applied to the first electrode of the first test cell and the second electrode of the second test cell, and the barrier region is an isolation region configured to electrically isolate the first test cell and the second test cell when a measurement voltage is applied to at least one of: the first electrode of the first test cell; and the second electrode of the second test cell.

According to yet another aspect of the inventive concept, there is provided a method of performing a TDDB test of a semiconductor device, the method including: preparing a TDDB test structure of a semiconductor device including a plurality of test cells having test patterns in which two electrodes are formed having a dielectric layer therebetween; applying a measurement voltage to each of test cells selected from the plurality of test cells and measuring first leakage current values; simultaneously applying a stress voltage to the selected test cells; applying the measurement voltage to each of the test cells to which the stress voltage has been applied and measuring second leakage current values; repeatedly performing the operations of the simultaneously applying of the stress voltage and applying the measurement voltage to measure a plurality of second leakage current values; and determining a TDDB value of a dielectric layer included in each of the selected test cells based on differences between the first and second leakage current values measured in the selected test cells.

Simultaneously applying the stress voltage to the selected test cells may include: separating the plurality of test cells into a plurality of test cell groups and applying the stress voltage to each of the plurality of test cell groups. The plurality of test cells may include high voltage test cells and low voltage test cells, and the stress voltage and the measurement voltage applied to the high voltage test cells may be greater than the stress voltage and the measurement voltage, respectively, applied to the low voltage test cells.

The TDDB value of the dielectric layer may be determined when the differences between the first and second leakage current values measured in the selected test cells may exceed a reference value. A test device may be used to determine the TDDB value of the dielectric layer, and may include a switching member for simultaneously applying the stress voltage, or selectively applying the measurement voltage, to the plurality of test cells.

A barrier region may be formed between the plurality of test cells to prevent electrical interference from occurring between the plurality of test cells when the stress voltage is simultaneously applied to the selected test cells. The barrier region formed between the plurality of test cells may be configured to prevent electrical interference from occurring between the plurality of test cells when the measurement voltage is applied to each of the selected test cells. The test patterns may be gate patterns or capacitor patterns.

According to still another aspect of the inventive concept, there is provided a test device for a semiconductor device associated with a semiconductor substrate. The test device comprises: at least first and second test cells separated and spaced apart from each other, each of the first and second test cells including first electrode, a second electrode, and a dielectric material disposed between the first and second electrodes; a switching device connected to each of the first and second test cells and configured to simultaneously apply a first stress voltage to the first test cell and a second test voltage to the second test cell to perform tests of a breakdown characteristic of the dielectric material of the first test cell and a breakdown characteristic of the dielectric material of the second test cell; and at least one barrier region disposed between the first and second test cells, the barrier region having a characteristic that prevents the tests of the breakdown characteristics of the dielectric materials of the first and second test cells from interfering with each other.

The at least one barrier region may prevent a current from flowing between the first and second test cells.

The switching device may be further configured to selectively measure a leakage current from each of the first and second test cells, one at a time.

The first electrode and the dielectric material of the first test cell may be formed on a first well of a first conductivity type disposed in the semiconductor substrate, and the first electrode and the dielectric material of the second test cell may be formed on a second well of a first conductivity type disposed in the semiconductor substrate, and the barrier region may be a well of a second conductivity type that is opposite to the first conductivity type.

The switching device may be connected to the first electrode of the first test cell and the first electrode of the second test cell. The switching device may be configured to simultaneously apply the first stress voltage to the first electrode of the first test cell and the second test voltage to the first electrode of the second test cell. And when the tests of the breakdown characteristic of the dielectric material of the first test cell and the breakdown characteristic of the dielectric material of the second test cell are performed the semiconductor substrate may be connected to ground.

The first stress voltage and the second stress voltage may have a same voltage level.

The dielectric material of the first test cell may be thicker that the dielectric material of the second test cell and the first stress voltage may be greater than the second stress voltage.

The test device may include a first plurality of test cells including the first test cell, and a second plurality of test cells including the second test cell. The switching device may be connected to each of the first and second plurality of test cells and may be configured to simultaneously apply a first stress voltage to the first plurality of test cells and a second test voltage to the second plurality of test cells, and the first stress voltage may be different than the second stress voltage.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
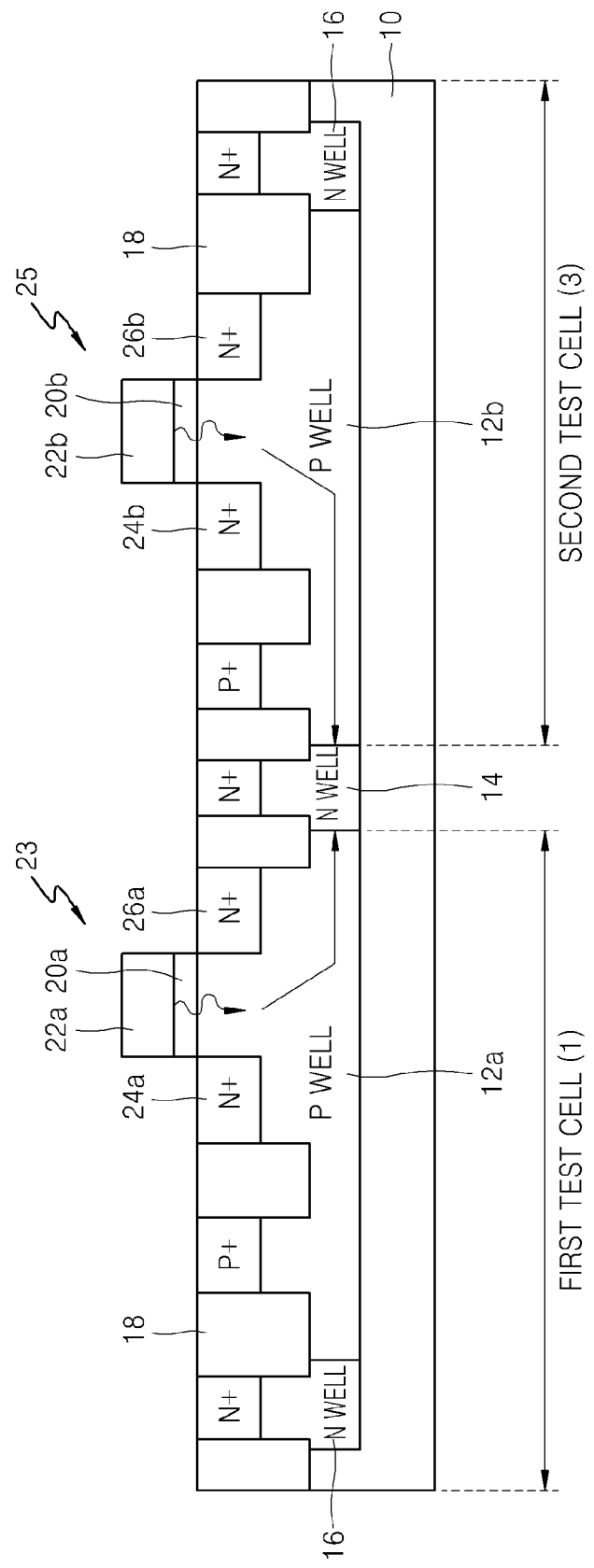
FIGS. 1 and 2 are schematic cross-sectional and plan views, respectively, of a time dependent dielectric breakdown (TDDB) test structure of a semiconductor device according to an exemplary embodiment of the inventive concept.

The inventive concept will now be described more fully with reference to the accompanying drawings, in which exemplary embodiments of the inventive concept are shown. The inventive concept may, however, be embodied in many different forms and should not be construed as being limited to the embodiments set forth herein; rather, these embodiments are provided so that this disclosure will be thorough and complete, and will fully convey the concept of the inventive concept. Like reference numerals in the drawings denote like elements, and thus their description will be omitted. In the drawings, the thicknesses of layers and regions are exaggerated for clarity.

The terminology used herein is for describing particular embodiments only and is not intended to be limiting of exemplary embodiments. As used herein, the singular forms "a," "an" and "the" are intended to include the plural forms as well, unless the context clearly indicates otherwise. It will be further understood that the terms "comprises" and/or "comprising" when used in this specification, specify the presence of stated features, integers, steps, operations, elements, components, and/or groups thereof, but do not preclude the presence or addition of one or more other features, integers, steps, operations, elements, components, and/or groups thereof.

Unless otherwise defined, all terms (including technical and scientific terms) used herein have the same meaning as commonly understood in the art to which exemplary embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
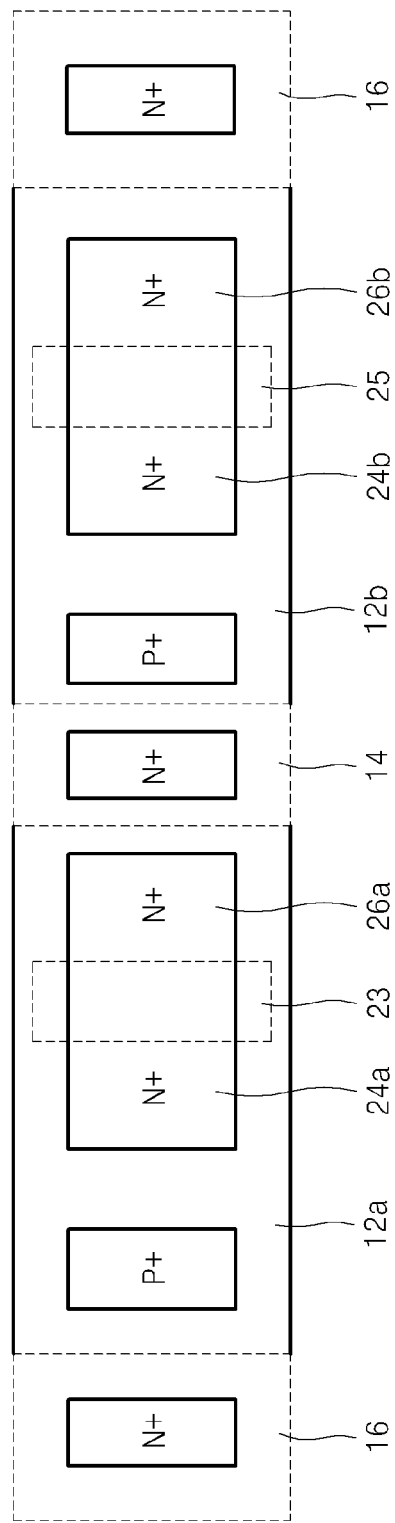

FIGS. 1 and 2 are schematic cross-sectional and plan views, respectively, of a time dependent dielectric breakdown (TDDB) test structure of a semiconductor device according to an exemplary embodiment of the inventive concept.

Referring to FIG. 1, the TDDB test structure of the semiconductor device includes a first test cell 1 and a second test cell 3 provided with a semiconductor substrate 10, for example, a silicon substrate. Semiconductor substrate 10 may be a wafer, for example, a silicon wafer. First test cell 1 and second test cell 3 are exemplary, and in general a plurality of test cells greater than two may be provided with semiconductor substrate 10.

First test cell 1 includes a first test pattern 23. First test pattern 23 is used to measure a TDDB of a first dielectric layer 20a. First test pattern 23 may be provided with a semiconductor substrate 10 in which a first well of a first conductivity type, i.e. a P well 12a, is formed, and the first test pattern may include first dielectric layer 20a formed on semiconductor substrate 10, and a first gate electrode 22a. In other words, first test pattern 23 may be a gate pattern including at least a portion of semiconductor substrate 10, first dielectric layer 20a formed on semiconductor substrate 10, and first gate electrode 22a formed on first dielectric layer 20a. First dielectric layer 20a may be a silicon oxide layer.

Semiconductor substrate 10 in which P well 12a is formed may be a lower electrode, and the gate electrode 22a may be an upper electrode for first test pattern 23. Thus, first test pattern 23 may be a capacitor pattern including the lower electrode, first dielectric layer 20a that is a capacitor dielectric layer, and the upper electrode (i.e., electrode 22a).

N+ impurity regions 24a and 26a having a second conductivity type opposite to the first conductivity type may be formed in semiconductor substrate 10 at both sides of first test pattern 23. N+ impurity region 24a may be a source region in a transistor structure. N+ impurity region 26a may be a drain region in the transistor structure. First test pattern 23 may be electrically separated with device isolation region(s) 18. Device isolation region 18 of first test cell 1 may be a trench insulation film, for example, an oxide film. Second wells of a second conductivity type, i.e. N wells 16, may be formed in semiconductor substrate 10 adjacent to P wells 12 of first test cell 1.

Second test cell 3 may be formed in the same manner as first test cell 1. Second test cell 3 may be formed adjacent to first test cell 1. In contrast to what is illustrated in FIG. 1, in other embodiments second test cell 3 may be spaced further apart from first test cell 1. Second test cell 3 includes a second test pattern 25. Second test pattern 25 is used to measure a TDDB of second dielectric layer 20b. Second test pattern 25 is also provided with semiconductor substrate 10 in which a second well of a first conductivity type, i.e. a P well 12b, is formed. A second dielectric layer 20b is formed on semiconductor substrate 10, and a gate electrode 22b is formed on second dielectric layer 20b. In other words, second test pattern 25 may be a gate pattern including at least a portion of semiconductor substrate 10, second dielectric layer 20b formed on semiconductor substrate 10, and the second gate electrode 22b formed on the second gate dielectric layer 20b. Second dielectric layer 20b may be a silicon oxide film.

Semiconductor substrate 10 in which P wells 16 are formed may be a lower electrode, and gate electrode 22b may be an upper electrode in second test pattern 25. Thus, second test pattern 25 may be a capacitor pattern including the lower electrode, second dielectric layer 20b that is a capacitor dielectric layer, and the upper electrode (i.e., electrode 22b). N+ impurity regions 24b and 26b having the second conductivity type opposite to the first conductivity type may be formed in semiconductor substrate 10 at both sides of second test pattern 25. N+ impurity region 24b may be a source region in a transistor structure. N+ impurity region 26b may be a drain region in the transistor structure. Second test pattern 25 is electrically separated with device isolation region(s) 18. Device isolation region 18 of second test cell 25 may be a trench insulation film, for example, an oxide film. The wells of a second conductivity type, i.e. N wells 16, may be formed in semiconductor substrate 10 adjacent to P wells 12 of second test cell 3.

The TDDB test structure of the semiconductor device of the present embodiment of the inventive concept includes a barrier region 14. Barrier region 14 may be a current flow prevention region used to prevent current from flowing between first test cell 1 and second test cell 3 when a stress voltage is simultaneously applied to first test cell 1 and second test cell 3 to perform the TDDB test. Barrier region 14 may also be an isolation region configured to electrically separate or isolate first test cell 1 and second test cell 3 from each other when a measurement voltage is applied to first gate electrode 22a of first test cell 1 or to the second gate electrode 22b of second test cell 3.

Barrier region 14 may be a third well, i.e. an N well 14, having an opposite conductivity type to that of the P well 12, between first test cell 1 and second test cell 3. Barrier region/N well 14 may be used to prevent interference between first test cell 1 and second test cell 3 by preventing current from flowing as indicated by an arrow in FIG. 1 when a stress voltage is simultaneously applied to first gate electrode 22a of first test cell 1 and the second gate electrode 22b of second test cell 3 during the TDDB test. Barrier region 14 may be used to prevent interference between first test cell 1 and second test cell 3 when a measurement voltage is applied to first test cell 1 and second test cell 3 to perform the TDDB test, which will be described later.

Although not shown in FIGS. 1 and 2, in addition to first and second test cells 1 and 3, in general one or more functional or operational semiconductor devices also may be provided with semiconductor substrate 10 for performing one or more operations, for example, transistors, capacitors, switching devices, memory cells, etc., at least some of which also include a dielectric layer whose breakdown characteristic(s) can be expected to be similar to or the same as the breakdown characteristic(s) of first and/or second dielectric layers 20a and 20b of first and second test cells 1 and 3. Accordingly, the breakdown characteristic(s) of the dielectric layer(s) of the functional or operating semiconductor devices may be determined by testing the breakdown characteristic(s) of first and/or second test cell(s) 1 and 3.

With regard to the TDDB test structure of the semiconductor device of the present embodiment of the inventive concept, the stress voltage may be simultaneously applied to first test cell 1 and second test cell 3 to perform the TDDB test, and the measurement voltage may be applied to each of first test cell 1 and second test cell 3. In other words, the TDDB test structure of the semiconductor device of the present embodiment of the inventive concept may obtain TDDB of first dielectric layer 20a and second dielectric layer 20b by simultaneously applying the stress voltage to first gate electrode 22a of first test cell 1 and second gate electrode 22b of second test cell 3 during a single TDDB test, and applying the measurement voltage to each of first test cell 1 and second test cell 3. The TDDB test structure of the semiconductor device of the present embodiment of the inventive concept performs the TDDB test by applying the stress voltage once without performing a test process several times, thereby dramatically reducing the time taken to perform the TDDB test.

Figure 3:
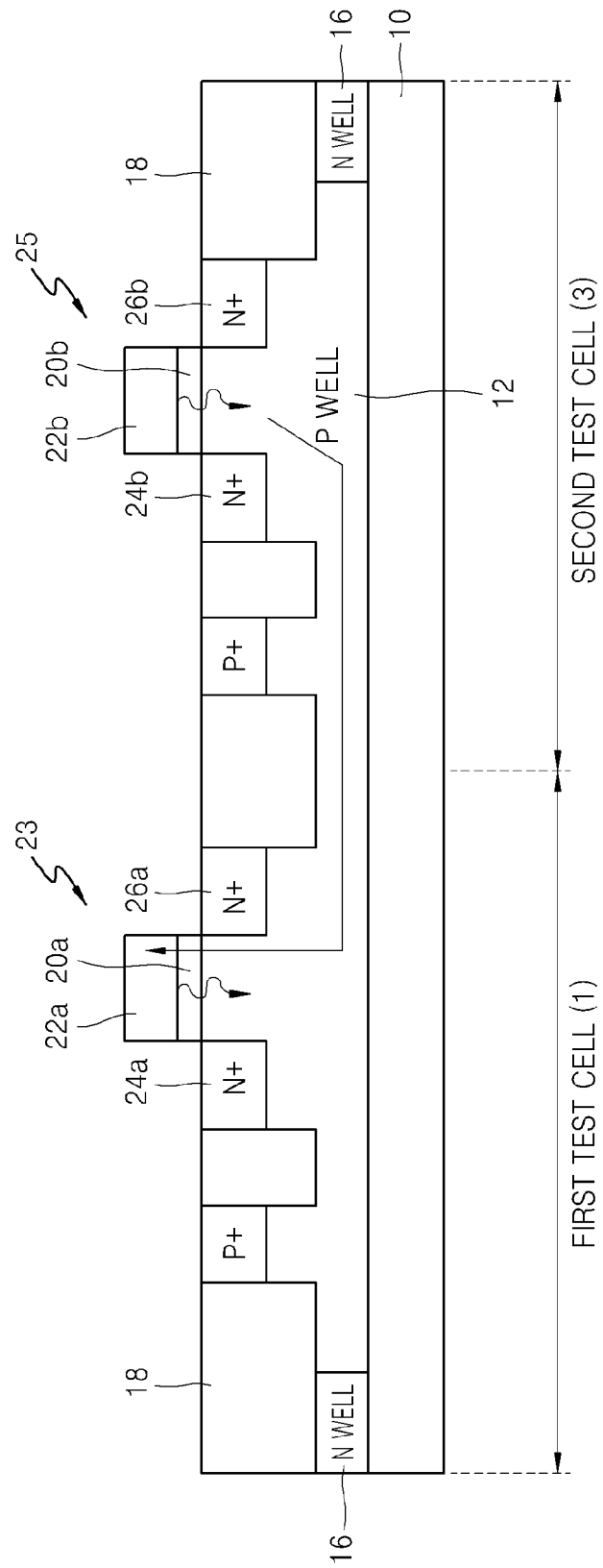
FIG. 3 is a schematic cross-sectional view of a TDDB test structure of a semiconductor device as a comparative example related to FIG. 1.

FIG. 3 is a schematic cross-sectional view of a TDDB test structure of a semiconductor device as a comparative example related to FIG. 1.

The TDDB test structure of the semiconductor device as a comparative example in FIG. 3 is almost the same as that described with reference to FIG. 1, except that barrier region 14 is not formed. With respect to the TDDB test structure of the semiconductor device as a comparative example in FIG. 3, when a stress voltage is simultaneously applied to first test cell 1 and second test cell 3 to perform a TDDB test, interference occurs between first test cell 1 and second test cell 3 as indicated by an arrow from second test device 12, through the common P-well 12, to first test device 10.

For example, if the stress voltage is applied to gate electrode 22b of second test cell 3 to perform the TDDB test, current flows as indicated by the arrow, and the stress voltage may be applied to gate electrode 22a of first test cell 1. That is, the stress voltage may be applied to gate electrode 22b of second test cell 3 from gate electrode 22a of first test cell 1 via the common P-well 12.

If interference occurs between first test cell 1 and second test cell 3 during the TDDB test, first test cell 1 and second test cell 3 cannot be simultaneously tested and instead must be separately tested, which increases the time taken to perform the TDDB test and deteriorates the productivity of the semiconductor device.

Although the TDDB test structure of the semiconductor device including the dielectric layers 20a and 20b and gate electrodes 22a and 22b formed on semiconductor substrate 10 are exemplarily described with reference to FIGS. 1 through 3, the TDDB test structure of the semiconductor device may be a capacitor structure including a lower electrode, a dielectric layer, and an upper electrode. If the dielectric layer is disposed between the upper electrode and the lower electrode, the TDDB test can be performed. A method of performing the TDDB test using the capacitor structure will be descried below.

FIGS. 4 through 7 are diagrams for explaining a test device 40 for performing a TDDB test using a TDDB test structure of a semiconductor device according to an exemplary embodiment of the inventive concept.

Figure 4:
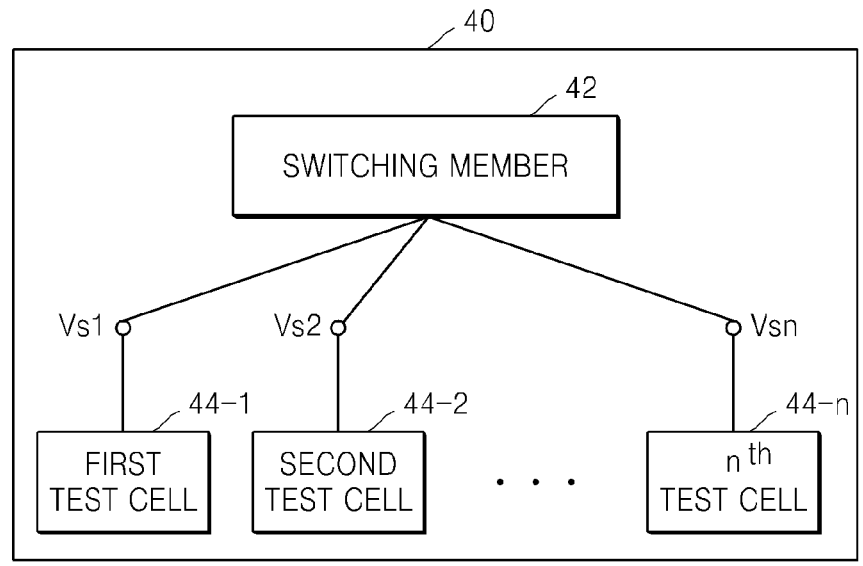
FIGS. 4 through 7 are diagrams for explaining a test device for performing a TDDB test using a TDDB test structure of a semiconductor device according to an exemplary embodiment of the inventive concept.
Figure 5:
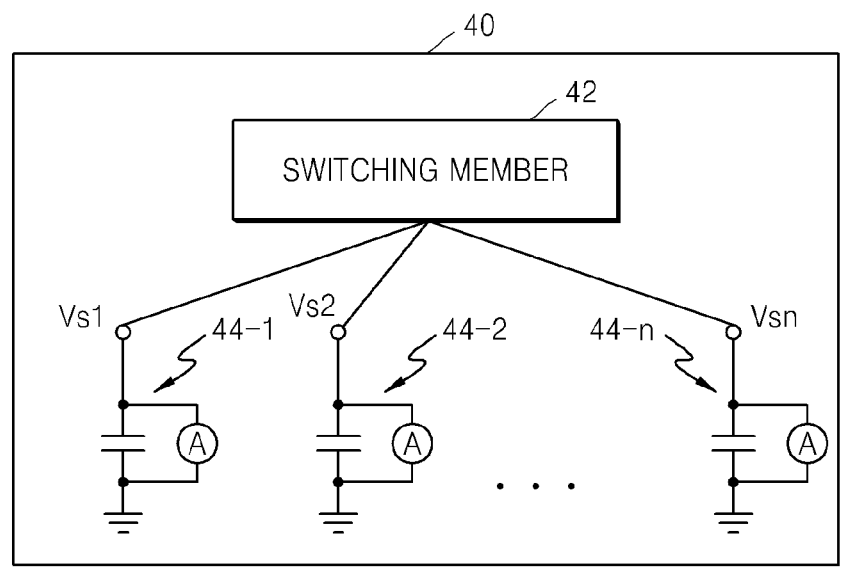
Figure 6:
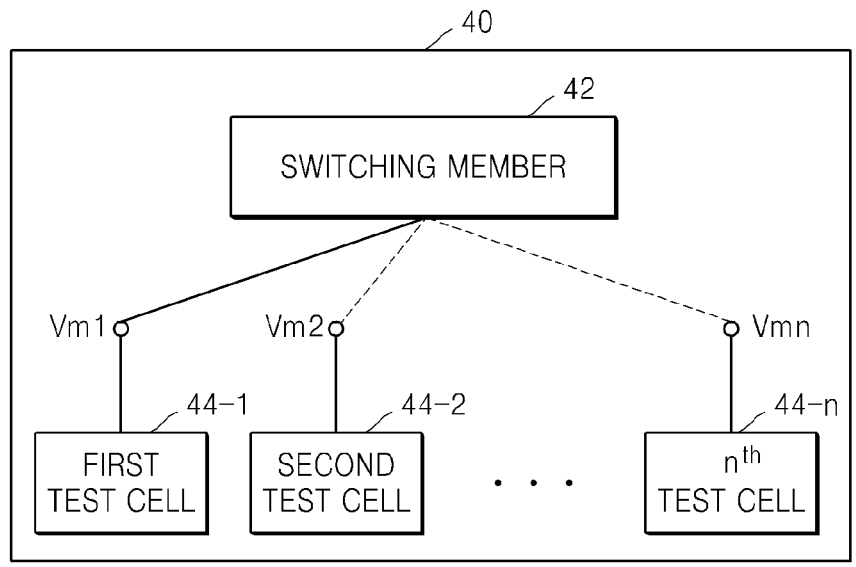
Figure 7:
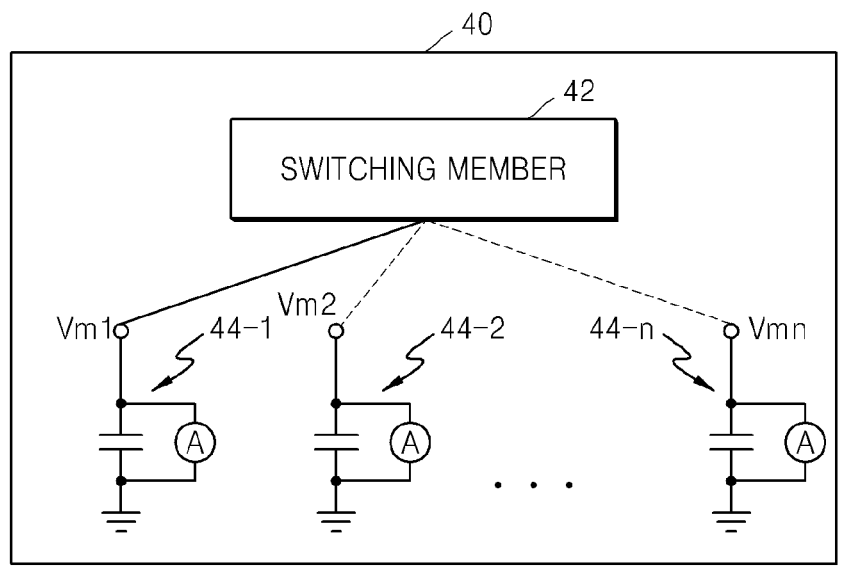

In particular, FIGS. 4 and 5 illustrate a process for applying stress voltages to test cells using test device 40 during the TDDB test of the semiconductor device, and FIGS. 6 and 7 illustrate a process for applying measurement voltages to test cells to measure leakage current using test device 40 during the TDDB test of the semiconductor device. Test device 40 for performing the TDDB test may include a switching member 42 for simultaneously or selectively applying voltages to test cells 44-1, 44-2, . . . 44-n (n is a positive integer).

Referring to FIGS. 4 and 5, the test device 40 may include the plurality of test cells 44-1, 44-2, . . . 44-n, and a barrier region used to prevent interference between test cells 44-1, 44-2, . . . 44-n as shown in FIGS. 1 and 2. Switching member 42 may be a switching circuit. Stress voltages $Vs1, Vs2, \ldots Vsn$ may be simultaneously applied to test cells 44-1, 44-2, . . . 44-n during the TDDB test in order to reduce time taken to perform the TDDB test. An ammeter may be installed between upper and lower electrodes of each of the test cells 44-1, 44-2, . . . 44-n.

Referring to FIGS. 6 and 7, after simultaneously applying the stress voltages $Vs1, Vs2, \ldots Vsn$ to the test cells 44-1, 44-2, . . . 44-n, measurement voltages $Vm1, Vm2, \ldots Vmn$ (m and n are positive integers) for measuring leakage current may be applied to each of test cells 44-1, 44-2, . . . 44-n using switching member 42 in order to prevent interference from occurring between test cells 44-1, 44-2, . . . 44-n.

Figure 8:
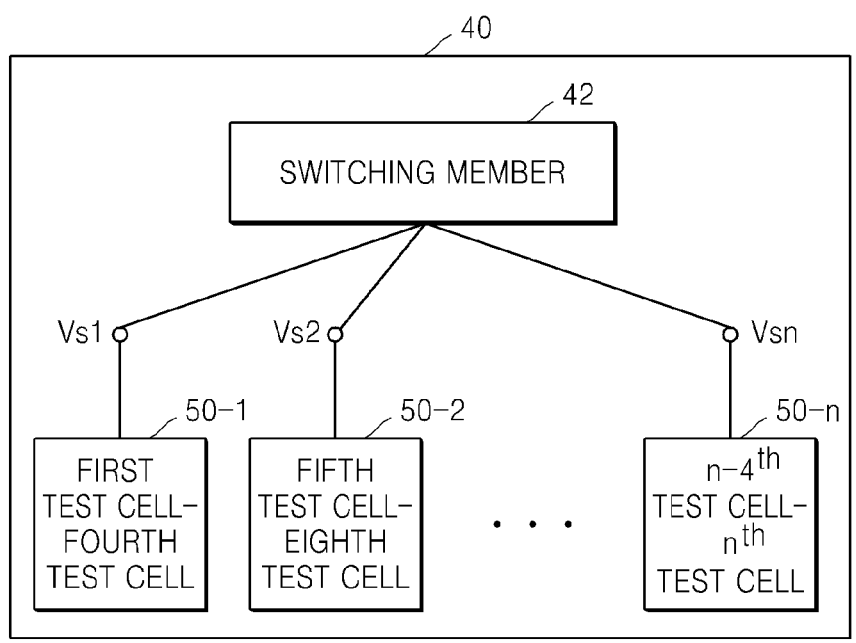
FIGS. 8 and 9 are diagrams for explaining a test device for performing a TDDB test using a TDDB test structure of a semiconductor device according to another exemplary embodiment of the inventive concept.
Figure 9:
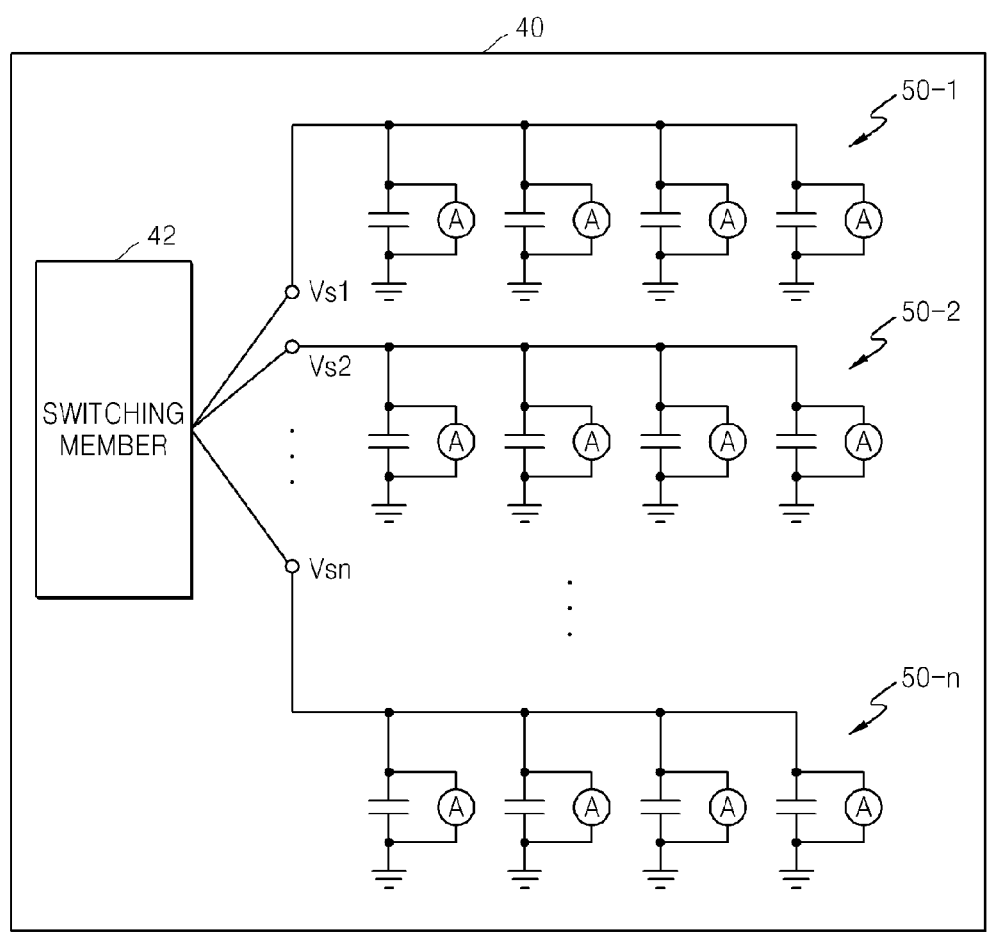

FIGS. 8 and 9 are diagrams for explaining a test device for performing a TDDB test using a TDDB test structure of a semiconductor device according to another exemplary embodiment of the inventive concept.

In more detail, FIGS. 8 and 9 illustrate a process for applying stress voltages to test cell groups 50-1, 50-2, . . . 50-n (n is a positive integer) using test device 40 during the TDDB test of the semiconductor device. Unlike FIGS. 4 and 5 illustrating that the stress voltages $Vs1, Vs2, \ldots Vsn$ are simultaneously applied to test cells 44-1, 44-2, . . . 44-n, stress voltages are simultaneously applied to each of test cell groups 50-1, 50-2, . . . 50-n. In other words, each of test cell groups 50-1, 50-2, . . . 50-n is grouped as a plurality of test cells, for example, four test cells, and stress voltages are simultaneously applied to each of test cell groups 50-1, 50-2, . . . 50-n, thereby more efficiently applying stress voltages to each of test cell groups 50-1, 50-2, . . . 50-n.

In each of test cell groups 50-1, 50-2, . . . 50-n, the measurement voltages $Vm1, Vm2, \ldots Vmn$ for measuring leakage current may be applied to each of the test cells in order to prevent interference from occurring between the test cells as described with reference to FIGS. 6 and 7.

FIGS. 10 through 13 are diagrams for explaining a test device for performing a TDDB test using a TDDB test structure of a semiconductor device according to another exemplary embodiment of the inventive concept.

Figure 10:
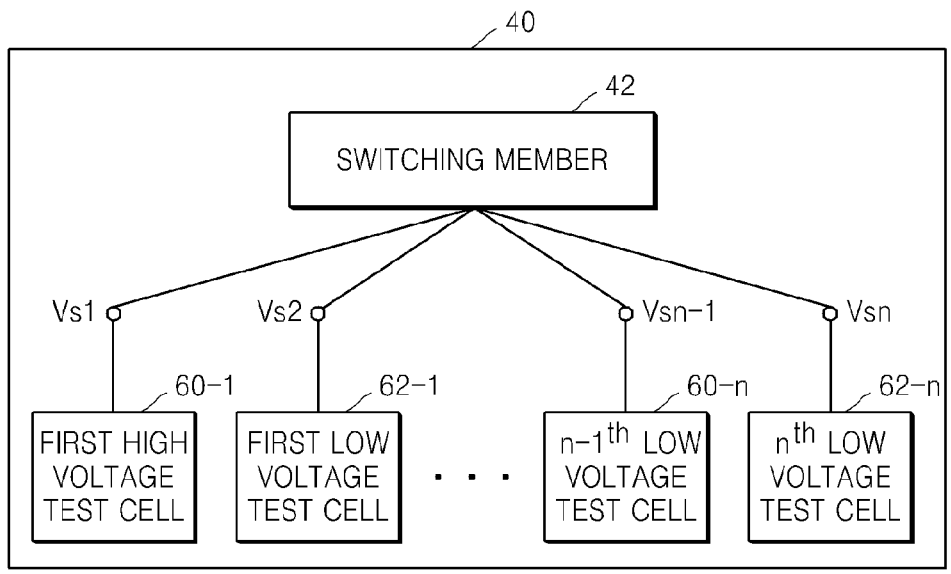
FIGS. 10 through 13 are diagrams for explaining a test device for performing a TDDB test using a TDDB test structure of a semiconductor device according to another exemplary embodiment of the inventive concept.
Figure 11:
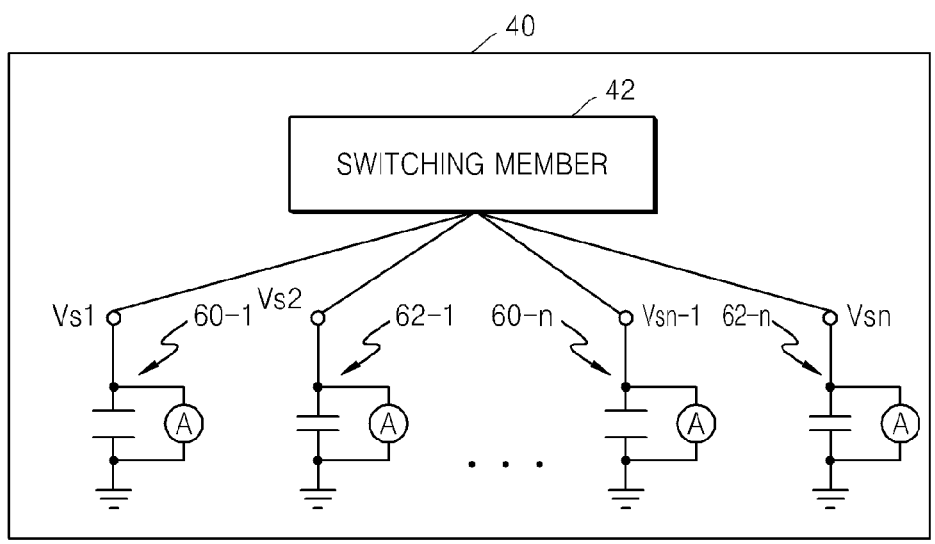
Figure 12:
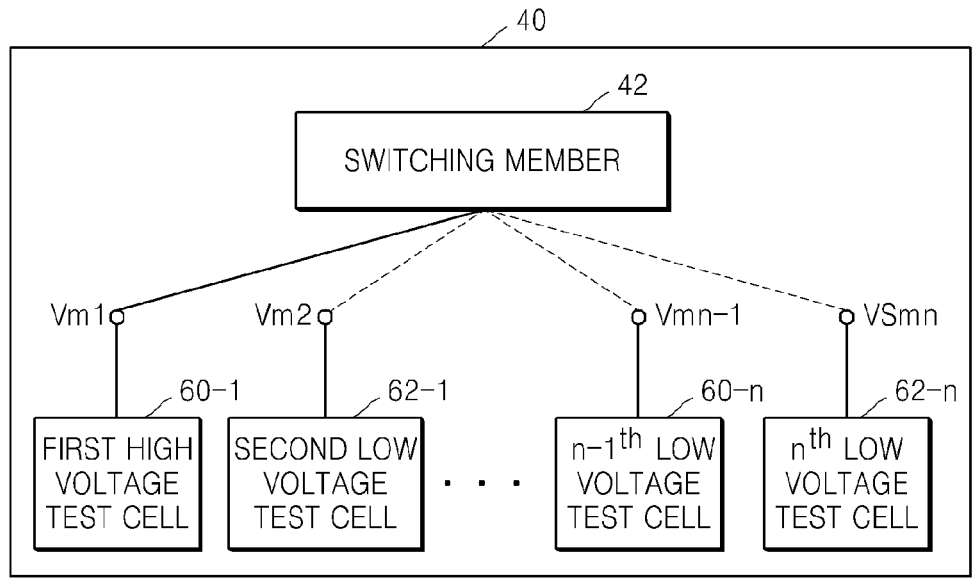
Figure 13:
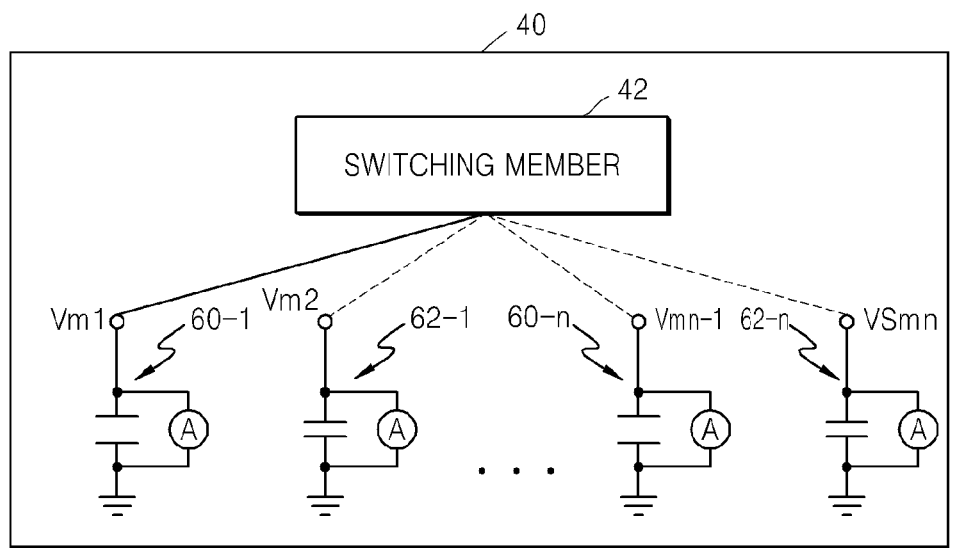

In particular, FIGS. 10 and 11 illustrate a process for applying stress voltages to test cells using test device 40 during the TDDB test of the semiconductor device, and FIGS. 12 and 13 illustrate a process for applying measurement voltages used to measure leakage current to test cells using the test device 40 during the TDDB test of the semiconductor device.

Test device 40 for performing the TDDB test may include the switching member 42 for simultaneously or selectively applying voltages to high voltage test cells 60-1, . . . 60-n (n is a positive integer) and low voltage test cells 62-1, . . . 62-n. Dielectric layers of high voltage test cells 60-1, . . . 60-n are thicker than those of low voltage test cells 62-1, . . . 62-n so that greater stress voltages and measurement voltages may be applied to the high voltage test cells 60-1, ... 60-n than low voltage test cells 62-1, ... 62-n.

Referring to FIGS. 10 and 11, test device 40 may include the plurality of high voltage test cells 60-1, ... 60-n and the plurality of low voltage test cells 62-1, ... 62-n, and a barrier region may be formed to prevent interference from occurring between high voltage test cells 60-1, ... 60-n and low voltage test cells 62-1, ... 62-n as described in the previous embodiment.

The stress voltages Vs1, Vs2, ... VSn are simultaneously applied to high voltage test cells 60-1, ... 60-n and the low voltage test cells 62-1, ..., 62-n during the TDDB test in order to reduce the time taken to perform the TDDB test. A first stress voltage, for example, 10V, may be applied to high voltage test cells 60-1, ..., 60-n, and a second stress voltage less than the first stress voltage, for example, 5V, may be applied to the low voltage test cells 62-1, ... 62-n. An ammeter (ampere meter) may be installed between upper and lower electrodes of high voltage test cells 60-1, ... 60-n and low voltage test cells 62-1, ..., 62-n.

Referring to FIGS. 12 and 13, after simultaneously applying the stress voltages Vs1, Vs2, ... Vsn to high voltage test cells 60-1, ... 60-n and low voltage test cells 62-1, ... 62-n, measurement voltages Vm1, Vm2, ... Vmn (m and n are a positive integer) used to measure leakage current may be applied to each of the high voltage test cells 60-1, ... 60-n and the low voltage test cells 62-1, ... 62-n using switching member 42 in order to prevent interference from occurring between high voltage test cells 60-1, ... 60-n and low voltage test cells 62-1, ... 62-n. A first measurement voltage, for example, 3.3V, may be applied to high voltage test cells 60-1, ... 60-n, and a second measurement voltage, for example, 1.5V, less than the first measurement voltage applied to high voltage test cells 60-1, ... 60-n may be applied to low voltage test cells 62-1, ... 62-n.

Figure 14:
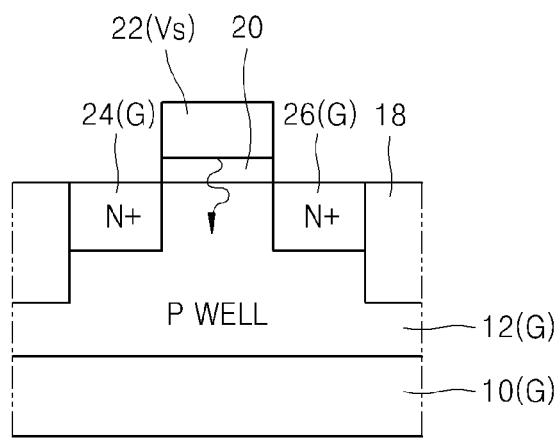
FIGS. 14 and 15 are cross-sectional views of a TDDB test structure of a semiconductor device to which a stress voltage and a measurement voltage are to be applied during a TDDB test according to an exemplary embodiment of the inventive concept.
Figure 15:
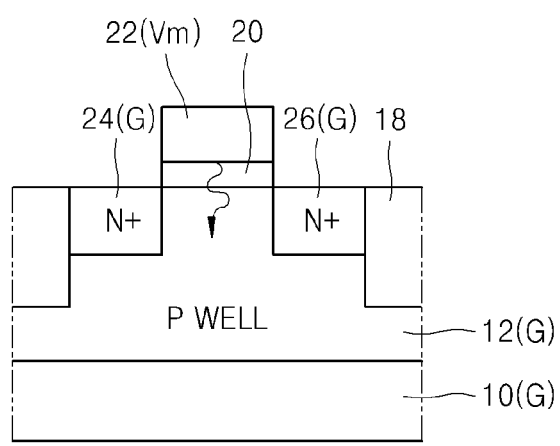

FIGS. 14 and 15 are cross-sectional views of a TDDB test structure of a semiconductor device to which stress voltages and measurement voltages are to be applied during a TDDB test according to an exemplary embodiment of the inventive concept.

In particular, FIGS. 14 and 15 are cross-sectional views of the TDDB test structure including first and second test patterns 23 and 25 shown in FIG. 1. Like reference numerals in FIGS. 1, 14, and 15 denote like elements. Referring to FIG. 14, the stress voltage Vs is applied during the TDDB test. Semiconductor substrate 10, P well 12, and N+ impurity regions 24 and 26 are grounded, and the stress voltage Vs, for example, 5V, is applied to gate electrode 22 to perform the TDDB test of dielectric layer 20.

Referring to FIG. 15, the measurement voltage is applied during the TDDB test. Semiconductor substrate 10, P well 12, and the N+ impurity regions 24 and 26 are grounded, and the measurement voltage Vm, for example, 1.5V, is applied to gate electrode 22 to perform the TDDB test of dielectric layer 20.

Figure 16:
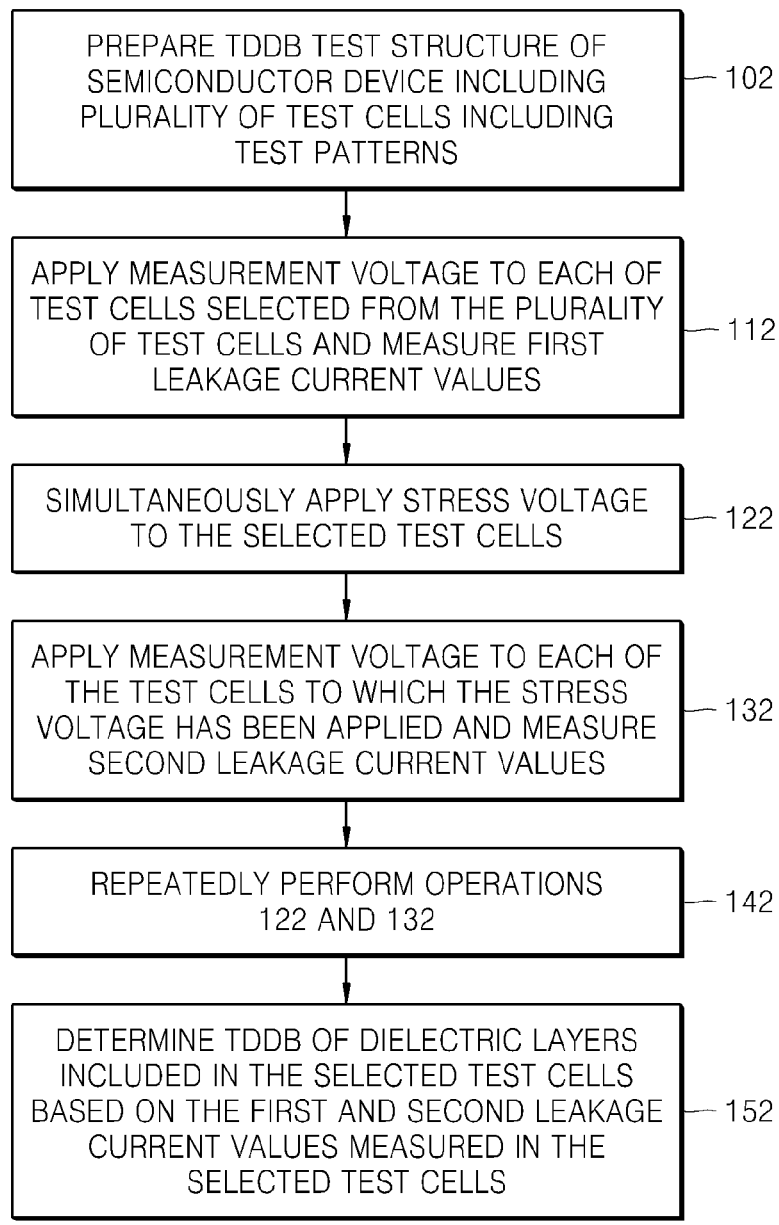
FIG. 16 is a flowchart illustrating a method of performing a TDDB test of a semiconductor device according to an exemplary embodiment of the inventive concept.

FIG. 16 is a flowchart illustrating a method of performing a TDDB test of a semiconductor device according to an exemplary embodiment of the inventive concept.

In particular, the method of performing the TDDB test of the semiconductor device of the present embodiment prepares a TDDB test structure of the semiconductor device including a plurality of test cells including, for example, the test patterns as shown in FIGS. 1 and 2 (operation 102).

A TDDB test structure of the semiconductor device includes a barrier region configured to prevent current from flowing between the test cells, and thereby to inhibit or remove interference therebetween as described above. The TDDB test structure of the semiconductor device according to the present embodiment may be a capacitor structure including a dielectric layer disposed between upper and lower electrodes as described above. The test cells may include high voltage test cells and low voltage test cells as described above.

The measurement voltage Vm is applied to each of selected test cells, for example as described above with reference to FIG. 15, and first leakage current values are measured (operation 112). In some embodiments, the measurement voltage may be provided sequentially or selectively to the selected test cells. For example, the measurement voltage may be applied to one selected test cell at a time.

A test device as described above is used to simultaneously apply the stress voltage Vs to the selected test cells, for example as described above with reference to FIG. 14 (operation 122).

The measurement voltage Vm is applied to each of the selected test cells to which the stress voltage Vs has been applied, for example s described above with reference to FIG. 15, and second leakage current values are measured (operation 132). In some embodiments, the measurement voltage is provided sequentially or selectively to the test cells to which the stress voltage Vs has been applied. For example, the measurement voltage may be applied to one test cell at a time.

Operations 122 and 132 are repeatedly performed (operation 142).

A TDDB value for the dielectric layers comprising the selected test cells is determined based on the first and second leakage current values measured in the selected test cells (operation 152). For example, the TDDB value as a breakdown time of the dielectric layers included in the selected test cells is determined based on differences between the first and second leakage current values measured in the selected test cells.

Figure 17:
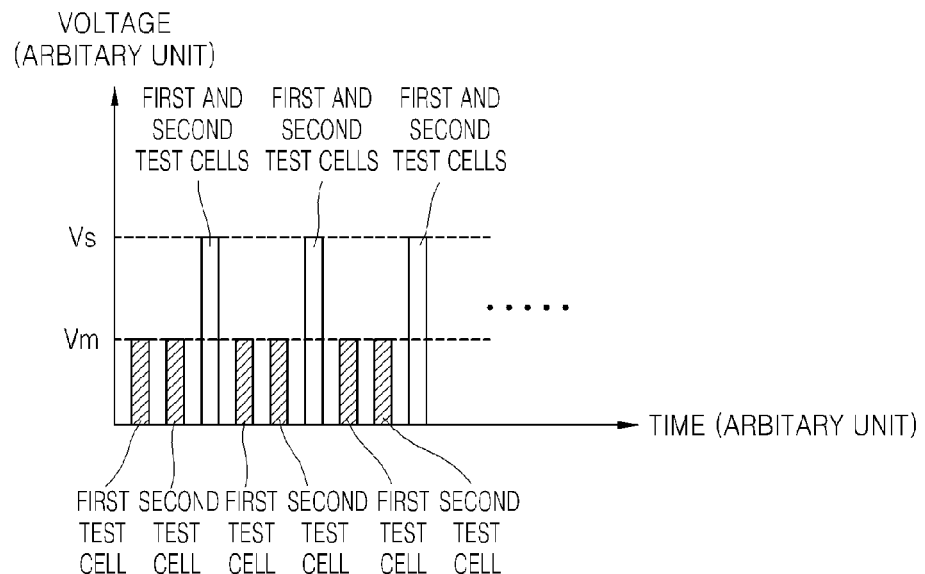
FIG. 17 is a graph of a stress voltage and a measurement voltage applied during a TDDB test of a semiconductor device according to an exemplary embodiment of the inventive concept.
Figure 18:
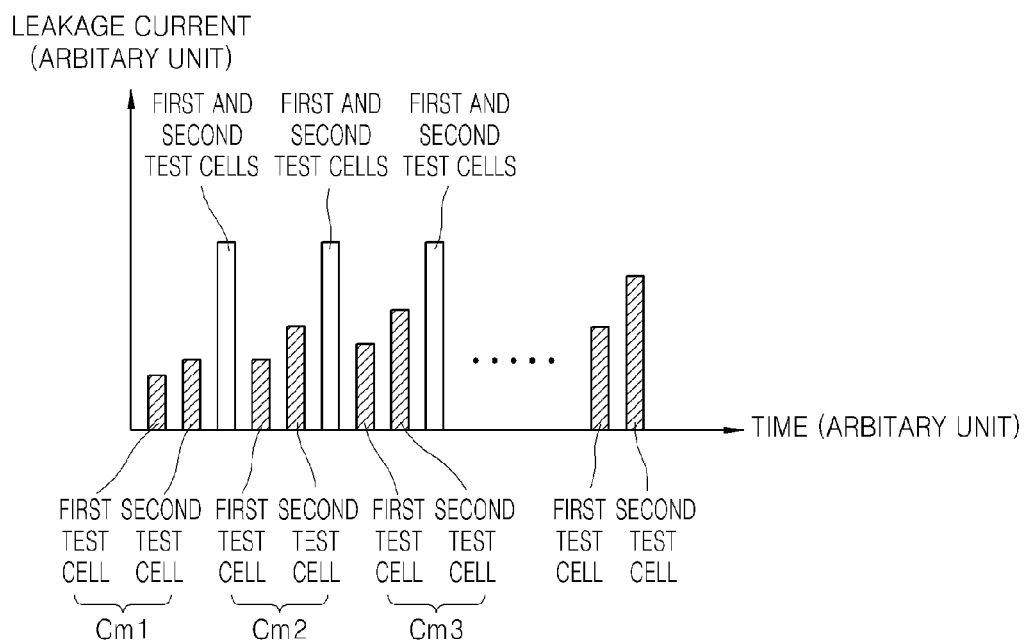
FIG. 18 is a graph of leakage current values of test cells when a stress voltage and a measurement voltage are applied during a TDDB test of a semiconductor device according to an exemplary embodiment of the inventive concept.
Figure 19:
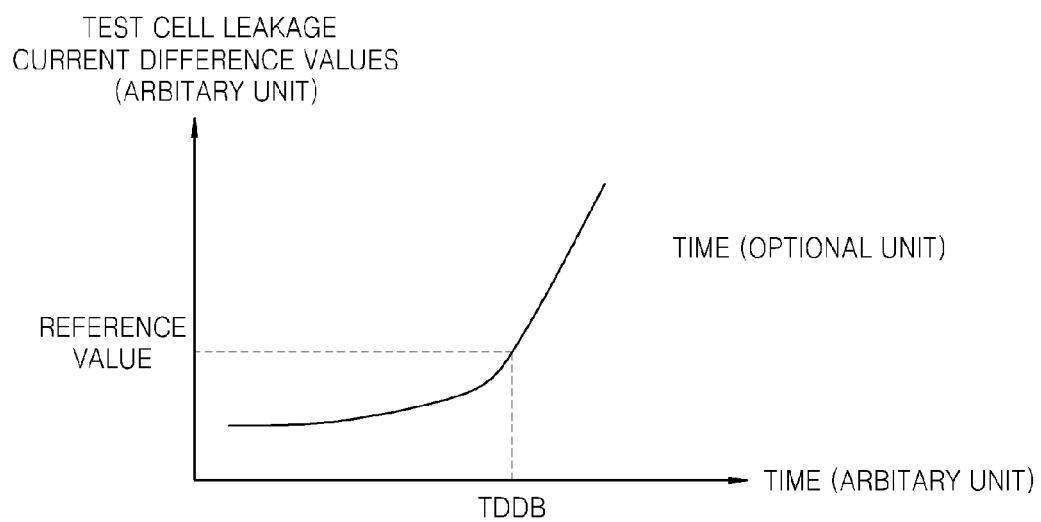
FIG. 19 is a graph of differences between leakage current values of test cells during a TDDB test of a semiconductor device according to an exemplary embodiment of the inventive concept.

FIG. 17 is a graph of a stress voltage and a measurement voltage applied during a TDDB test of a semiconductor device according to an exemplary embodiment of the inventive concept. FIG. 18 is a graph of leakage current values of test cells when a stress voltage and a measurement voltage are applied during a TDDB test of a semiconductor device according to an exemplary embodiment of the inventive concept. FIG. 19 is a graph of differences between leakage current values of test cells during a TDDB test of a semiconductor device according to an exemplary embodiment of the inventive concept.

In particular, referring to FIGS. 17 through 19, TDDB is determined using two test cells for ease of description. However, the method of performing the TDDB test of the present embodiment may be applied to a plurality of test cells more than two.

Referring to FIGS. 17 and 18, in the illustrated embodiment the measurement voltage Vm is separately or sequentially applied to the first and second test cells of a semiconductor device, and first leakage current values (Cm1) are measured separately or sequentially for each test cell. However, in other embodiments the measurement voltage Vm may be applied simultaneously to the first and second test cells. When the first and second test cells have the structures as shown in FIGS. 1 and 2, the measurement voltage Vm may be applied to each of the first test cell and the second test cell, for example under the conditions as described with reference to FIG. 15, and the first leakage current values (Cm1) are measured.

Thereafter, the stress voltage Vs is simultaneously applied to the first test cell and the second test cell. When the first and second test cells of the semiconductor device have the structures as shown in FIGS. 1 and 2, the stress voltage Vs is simultaneously applied to the first test cell and the second test cell, for example under the conditions as described above with reference to FIG. 14.

The measurement voltage Vm is repeatedly applied to each of the first test cell and the second test cell to which the stress voltage Vs has been applied, and intermediate leakage current values (Cm2) are measured. In the illustrated embodiment the measurement voltage Vm is separately or sequentially applied to the first second test cells, and intermediate leakage current values (Cm2) are measured separately or sequentially for each test cell. However, in other embodiments the measurement voltage Vm may be applied simultaneously to the first and second test cells. Next, the stress voltage Vs is simultaneously applied to the first test cell and the second test cell. Thereafter, the measurement voltage Vm is applied to each of the first test cell and the second test cell, and second leakage current values (Cm3) are measured. Again, in the illustrated embodiment the measurement voltage Vm is separately or sequentially applied to the first second test cells, and second leakage current values (Cm3) are measured separately or sequentially for each test cell. However, in other embodiments the measurement voltage Vm may be applied simultaneously to the first and second test cells.

Referring to FIG. 19, the graph shows the relationship of differences between the leakage current values of the first test cell and the second test cell, for example, differences between the first and second leakage current values of the first test cell and the second test cell, with respect to time. When the differences exceed a reference value, a TDDB value for a specific test cell is determined.

While the inventive concept has been particularly shown and described with reference to exemplary embodiments thereof, it will be understood that various changes in form and details may be made therein without departing from the spirit and scope of the following claims.

What is claimed is:

1. A method of performing a time dependent dielectric breakdown (TDDB) test of a semiconductor device, the method comprising:
    preparing a TDDB test structure of a semiconductor device including a plurality of test cells having test patterns in which two electrodes are formed having a dielectric layer therebetween;
    applying a measurement voltage to each of test cells selected from the plurality of test cells and measuring first leakage current values;
    simultaneously applying a stress voltage to the selected test cells;
    applying the measurement voltage to each of the test cells to which the stress voltage has been applied and measuring second leakage current values;
    repeatedly performing the operations of the simultaneously applying of the stress voltage and applying the measurement voltage to measure a plurality of second leakage current values; and
    determining a TDDB value of a dielectric layer included in each of the selected test cells based on differences between the first and second leakage current values measured in the selected test cells.

2. The method of claim 1, wherein simultaneously applying of the stress voltage to the selected test cells comprises:
    separating the plurality of test cells into a plurality of test cell groups; and
    applying the stress voltage to each of the plurality of test cell groups.

3. The method of claim 1, wherein the plurality of test cells comprise high voltage test cells and low voltage test cells, and wherein the stress voltage and the measurement voltage applied to the high voltage test cells are greater than the stress voltage and the measurement voltage, respectively, applied to the low voltage test cells.

4. The method of claim 1, wherein, when the differences between the first and second leakage current values measured in the selected test cells exceed a reference value, the TDDB value of the dielectric layer is determined.

5. The method of claim 1, wherein a test device is used to determine the TDDB of the dielectric layer, and the test device comprises a switching member configured to simultaneously apply the stress voltage to the plurality of test cells, or to selectively apply the measurement voltage to the plurality of test cells.

6. The method of claim 1, wherein a barrier region is formed between the plurality of test cells to prevent interference from occurring between the plurality of test cells when the stress voltage is simultaneously applied to the selected test cells.

7. The method of claim 1, wherein a barrier region is formed between the plurality of test cells so as to prevent interference from occurring between the plurality of test cells when the measurement voltage is applied to each of the selected test cells.

8. The method of claim 1, wherein the test patterns are gate patterns or capacitor patterns.

9. A test device for a semiconductor device associated with a semiconductor substrate, the test device comprising:
    at least first and second test cells separated and spaced apart from each other, each of the first and second test cells including first electrode, a second electrode, and a dielectric material disposed between the first and second electrodes;
    a switching device connected to each of the first and second test cells and configured to simultaneously apply a first stress voltage to the first test cell and a second test voltage to the second test cell to perform tests of a breakdown characteristic of the dielectric material of the first test cell and a breakdown characteristic of the dielectric material of the second test cell; and
    at least one barrier region disposed between the first and second test cells, the barrier region having a characteristic that prevents the tests of the breakdown characteristics of the dielectric materials of the first and second test cells from interfering with each other,
    wherein the barrier region includes a well disposed in the semiconductor substrate.

10. The test device of claim 9, wherein at least one barrier region prevents a current from flowing between the first and second test cells.

11. The test device of claim 9, wherein the switching device is further configured to selectively measure a leakage current from each of the first and second test cells, one at a time.

12. The test device of claim 9, wherein the first electrode and the dielectric material of the first test cell are formed on a first well of a first conductivity type disposed in the semiconductor substrate, wherein the first electrode and the dielectric material of the second test cell are formed on a second well of the first conductivity type disposed in the semiconductor substrate, wherein the well of the barrier region is of a second conductivity type that is opposite to the first conductivity type.

13. The test device of claim 12, wherein the switching device is connected to the first electrode of the first test cell and the first electrode of the second test cell, wherein the switching device is configured to simultaneously apply the first stress voltage to the first electrode of the first test cell and the second test voltage to the first electrode of the second test cell, and wherein when the tests of the breakdown characteristic of the dielectric material of the first test cell and the breakdown characteristic of the dielectric material of the second test cell are performed the semiconductor substrate is connected to ground.

14. The test device of claim 9 wherein the first stress voltage and the second stress voltage have a same voltage level as each other.

15. The test device of claim 9 where the dielectric material of the first test cell is thicker that the dielectric material of the second test cell and wherein the first stress voltage is greater than the second stress voltage.

16. The test device of claim 9, wherein the test device includes a first plurality of test cells including the first test cell, and a second plurality of test cells including the second test cell, wherein the switching device is connected to each of the first and second plurality of test cells and is configured to simultaneously apply the first stress voltage to the first plurality of test cells and the second test voltage to the second plurality of test cells, and wherein the first stress voltage is greater than the second stress voltage.

\* \* \* \* \*